United States Patent [19]
Ashar

[11] 3,840,409
[45] Oct. 8, 1974

[54] INSULATING LAYER PEDESTAL TRANSISTOR DEVICE AND PROCESS

[75] Inventor: Kanu G. Ashar, Wappingers Falls, N.Y.

[73] Assignee: International Business Machines Corporation, Armonk, N.Y.

[22] Filed: May 8, 1972

[21] Appl. No.: 251,517

Related U.S. Application Data

[62] Division of Ser. No. 19,562, March 16, 1970, abandoned.

[52] U.S. Cl. .................. 148/1.5, 148/175, 147/187, 317/235
[51] Int. Cl. .................. H01l 7/54
[58] Field of Search .................. 148/1.5, 175, 187; 317/235

[56] References Cited

UNITED STATES PATENTS

| | | | |
|---|---|---|---|
| 3,268,374 | 8/1966 | Anderson | 148/175 |
| 3,312,881 | 4/1967 | Yu | 317/235 |
| 3,494,809 | 2/1970 | Ross | 148/175 |
| 3,574,009 | 4/1971 | Chizinsky et al. | 148/187 |
| 3,597,667 | 8/1971 | Horn | 148/187 X |
| 3,666,548 | 5/1972 | Brack et al. | 148/1.5 UX |
| 3,677,837 | 7/1972 | Ashar | 148/175 |
| 3,717,515 | 2/1973 | Ashar | 148/175 |

*Primary Examiner*—L. DeWayne Rutledge
*Assistant Examiner*—J. M. Davis
*Attorney, Agent, or Firm*—Wolmar J. Stoffel

[57] ABSTRACT

Structures and processes of making high frequency self isolating pedestal transistors in P layer and non-self isolating pedestal transistor in N layer by employing an insulating layer formed by ion implementation to separate extrinsic collector and base region.

7 Claims, 5 Drawing Figures

INSULATING LAYER PEDESTAL TRANSISTOR DEVICE AND PROCESS

A division, of application Ser. No. 19,562 filed Mar. 16, 1970, now abandoned.

BACKGROUND OF THE INVENTION

1. Field of the Invention

This invention relates to semiconductor devices and more particularly to a device and process for forming a monolithic integrated circuit pedestal transistor.

2. Brief Description of the Prior Art

In U.S. Pat. No. 3,312,881, Yu, assigned to the assignee of the present application, there is disclosed a pedestal transistor structure in which switching speed is increased because the overall base to collector junction capacitance is reduced. This result is accomplished by positioning an intrinsic semiconductor material between the base and collector regions. However, capacitance reduction is limited by the dielectric constant of the silicon and the out and autodiffusions of impurities into the intrinsic semiconductor material during subsequent processing. Finally, the semiconductor intrinsic layer provides no other functional end other than that of reducing base to collector capacitance and may not be used for electrical isolation purposes.

SUMMARY OF THE INVENTION

It is, therefore, an object of the present invention to provide a self isolating epi-base pedestal in P layer or a non-self isolating diffused base pedestal in N layer device and process for making the same which possesses improved base to collector capacitance characteristics, with the concommitant ability to withstand higher breakdown voltages.

It is another object of the present invention to provide a pedestal transistor device and process for making the same in which improved electrical characteristics are obtainable, i.e., higher switching speeds and high breakdown voltages, while simultaneously gaining electrical isolation benefits without complicating the process steps or resulting structure.

In accordance with the aforementioned objects, the present invention provides a pedestal transistor structure and process for making the same in which an insulating layer, e.g. silicon nitride, is located between the extrinsic collector region and the base region.

The foregoing other objects, features and advantages of the present invention will be apparent from the following more particular description of the embodiments of the invention, as illustrated in the accompanying drawings:

BRIEF DESCRIPTION OF THE PREFERRED EMBODIMENTS

Figure 1:
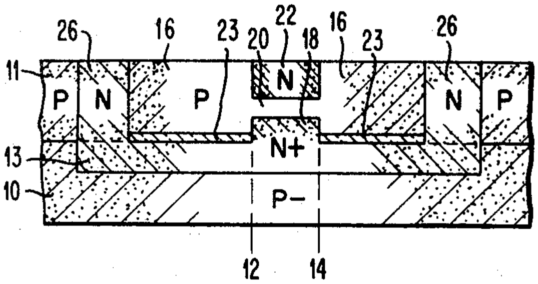
FIG. 1 illustrates an epitaxial base pedestal transistor in which the insulating layer extends only along the horizontal base-collector junction.

FIG. 1 discloses one embodiment of a monolithic epitaxial base pedestal transistor having improved operating characteristics. The monolithic circuit included a P-substrate 10 and an epitaxial upper layer 11 in which has been formed a pedestal transistor. The pedestal transistor comprises an internal portion which is located between the lines 12 and 14. The actual transistor action occurs in the internal portion of the transistor. The portion of the transistor which is external to the lines 12 and 14 is designated the extrinsic portion of the transistor. Accordingly, the pedestal transistor further comprises N+ type conductivity extrinsic subcollector portions 13 and P type extrinsic base regions 16. The internal portion of the transistor comprises an N+ type internal pedestal collector region 18, P type internal base region 20, and N type internal emitter region 22. An insulating layer 23, such as silicon nitride, is located between the extrinsic collector and base regions 13 and 16, respectively. In the epitaxial base type transistor of FIG. 1, N conductivity type diffusion regions 26 serve as a reach-through contact region for the subcollector regions 13 as well as completing the N side of the PN junction which electrically isolates the pedestal transistor from other devices (not shown) formed on the substrate 10.

Figure 2:
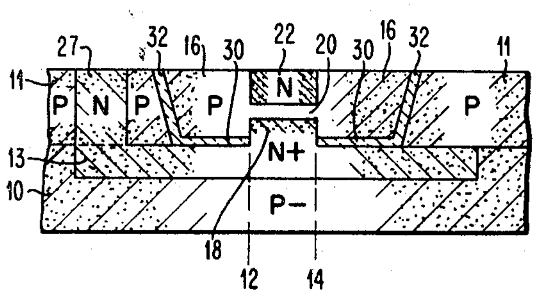
FIG. 2 illustrates an epitaxial base pedestal transistor in which the insulating layer functions to reduce base-collector capacitance and also functions to provide partial electrical isolation to the transistor device.

FIG. 2 is a slight modification of the embodiment shown in FIG. 1 and like numerals are employed to indicate like elements. However, in the structure of FIG. 2, the insulating layer formerly shown as 23 is now extended so as to include horizontal portions 30 and vertical portions 32, which extend to the upper surface of the epitaxial layer 11. The vertical portions 32 further reduce the capacitance at the extrinsic vertical base to collector junction. In this embodiment the surrounding N diffusion region for isolation is unnecessary since the insulating layer 32 provides complete isolation. The N diffused region 27 functions only to provide a low resistance contact to subcollector 13. Moreover, the base and collector regions separated by the insulating layer 32 can be subjected to much higher voltages without breaking down. Semiconductor power devices require this characteristic.

Figure 3:
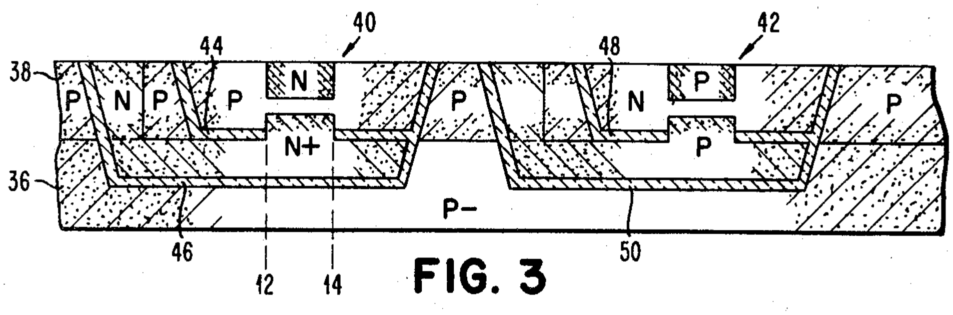
FIG. 3 illustrates an epitaxial base pedestal transistor in which the insulating layer has been extended to provide additional electrical isolation so as to allow the fabrication of PNP and NPN transistors in a single substrate.

In FIG. 3, the embodiment of FIG. 2 is further modified to include an additional electrical isolation envelope. This structure possesses all the advantages of the previous embodiments but further allows complementary type devices, i.e., NPN and PNP, to be fabricated on the same substrate. The monolithic circuit comprises a substrate 36 and an epitaxial layer 38. By way of example, a NPN pedestal transistor 40 and a PNP transistor 42 are formed within the substrate and epitaxial region 36 and 38. As previously described, the pedestal transistor 40 comprises an insulating layer 44 which separates the extrinsic collector to base regions. Additionally, one side of the layer 44 is extended to form an isolation envelope 46 so as to completely encircle or surround the pedestal NPN transistor 40. Similarly, insulating layer 48 separates the base-collector junction of PNP transistor 42 and the extension thereof forms isolation envelope 50 for electrically isolating its attendant device. The insulating layers and isolation envelopes are illustratively described as being silicon nitride, but it is to be realized that other suitable insulating materials may be created by converting silicon, e.g., $SiO_2$. Of course, the structure of FIG. 3 is readily implemented in an N type epitaxial device.

A silicon nitride insulating layer possesses a low dielectric constant and therefore greatly reduces the capacitance at the junction formed by the extrinsic base to collector regions. The presence of a dielectric layer eliminates any undesirable outdiffusions during subsequent processing, thus allowing better control. An insulating layer also eliminates leakage currents normally prevalent in PN junctions. This feature allows more complicated structures to be more readily fabricated, such as, inverted (collector on top) devices and low current devices for use in memory switching applications.

Figure 4:
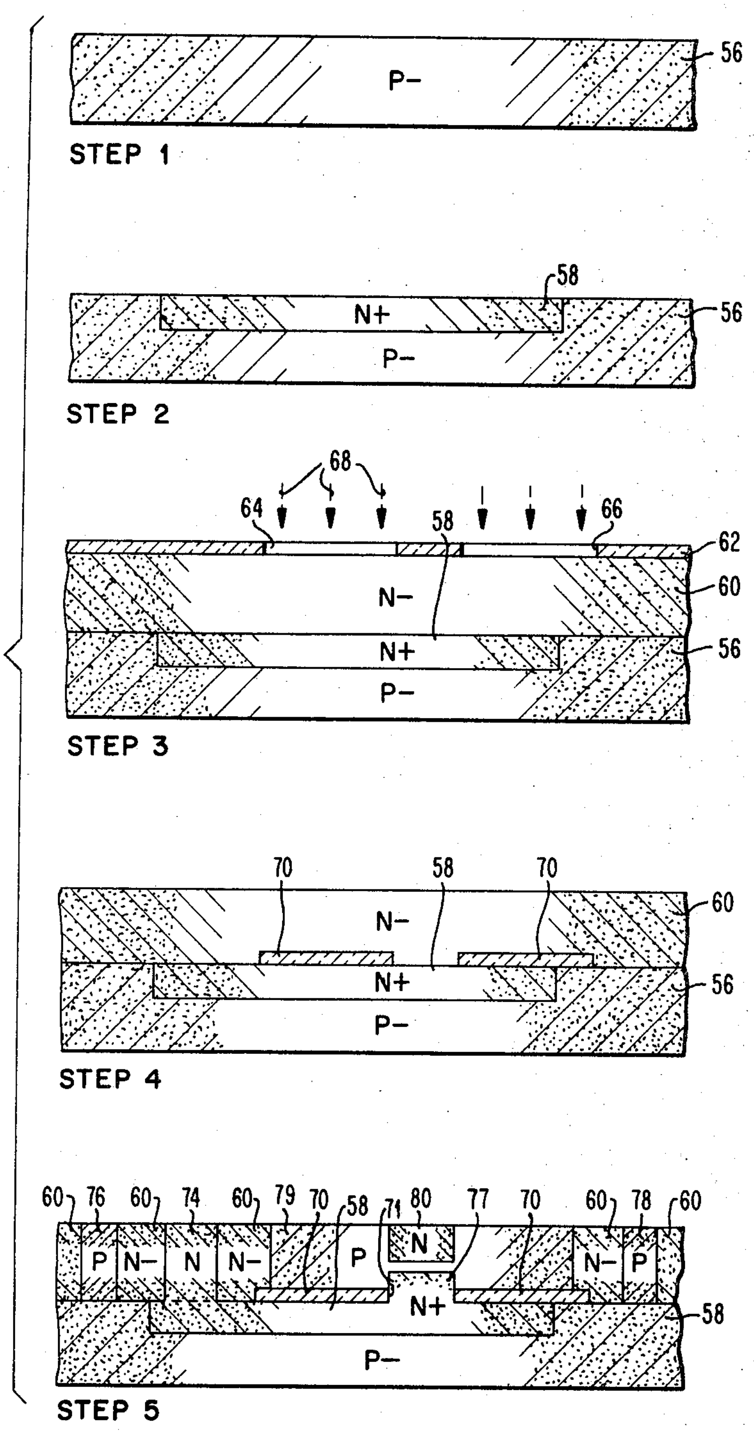
FIG. 4 illustrates the successive process steps employed to fabricate the structure of the present invention for a diffused base pedestal transistor.

FIG. 4 illustrates the successive steps required to fabricate an N epitaxial type pedestal transistor having an insulating layer located between the extrinsic base to collector junction. Again, the process steps for forming the insulating layer are applicable to an epitaxial base structure. In step 1, a P- starting substrate wafer 56 is provided. Next, a buried N+ subcollector region 58 is formed in the substrate using conventional diffusion techniques. Then, an N- epitaxial layer 60 is grown over the substrate 56. A mask 62 having selective openings 64 and 66 is then positioned on the upper surface of the epitaxial layer 60. The openings 64 and 66 are aligned over the region where it is desired to form a buried insulating layer. High energy ions (mev), schematically shown at 68, are introduced by ion implantation techniques through the mask opening 64 and 66 in order to form a buried insulating layer 70 which is positioned over the buried subcollector region 58. Implantation of nitrogen ions at these high energies is known to create insulating layer of silicon nitride.

Figure 5:
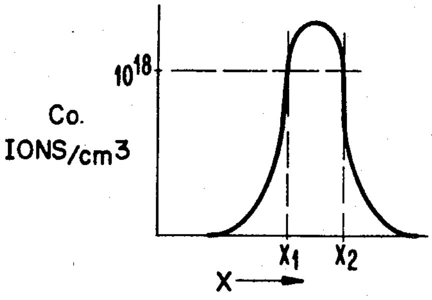
FIG. 5 illustrates graphically how the depth and position of the ion implanted layer may be controlled.

The concentration and the position of the insulating layer 70 is controlled in accordance with known principles of ion implantation illustrated in the plot in FIG. 5. The principles of an ion implantation process suitable to the present invention are described in U.S. Pat. No. 3,666,548. Brack et al, assigned to the assignee of the present application. From the curve in FIG. 5, it is readily apparent that the energy content of the source material determines the depth at which the insulating layer is ultimately located.

During further processing, an N reach through contact region 74 is diffused into the upper epitaxial region to provide a low resistance contact to the N+ subcollector layer 58. Finally, surrounding P region 76 and 78 are diffused into the upper epitaxial layer in order to provide electrical isolation for the pedestal transistor. Also, conventional diffusion steps are employed to form base region 79 and emitter region 80. During the processing steps illustrated in step 5, a portion of the subcollector region 58 diffuses through the opening 71 in the insulating layer 70 so as to form an internal collector pedestal region 77, which into extends towards the diffused emitter region 80. The insulating layer 70, in addition to providing the structural advantages previously mentioned, also prevents undesirable outdiffusion from the buried subcollector region into the epitaxial layer during the thermal cycle time required for the process steps depicted in step 5. Also, it is significant to note that the internal or active part of the transistor is excluded from the high energy ion bombardment which may sometimes cause strains to be set up in the semiconductor material.

In the pedestal structures illustrated in FIGS. 2 and 3, there is shown insulating layers having vertical portions. The vertical portions can be fabricated using an ion implantation process which uses a segmented mask process. Also, the vertical sides can be fabricated simultaneously with the formation of the horizontal walls by employing a graded mask process as disclosed in U.S. Pat. No. 3,666,548.

Finally, although well known diffusion process steps are combined with the ion implantation process for form the insulating layer in the preferred embodiments, it is possible to form the entire monolithic circuit by ion implantation techniques and thus avoid diffusion processes.

While the invention has been particularly shown and described with reference to the preferred embodiments thereof, it will be understood by those skilled in the arts that the foregoing and other changes in form and detail may be made therein without departing from the spirit and scope of the invention.

What is claimed is:

1. A method for fabricating a pedestal transistor in monolithic form comprising the steps of:

a. providing a substrate;
b. introducing an impurity into the substrate to form an extrinsic buried subcollector region;
c. forming an epitaxial layer over the substrate;
d. introducing an amorphous insulating layer into the epitaxial layer, the insulating layer being positioned over the extrinsic buried subcollector region;
e. forming a base and emitter region; and
f. treating the substrate and epitaxial layer so as to form a pedestal internal collector region by allowing the impurities in the subcollector region to extend upward into the expitaxial layer so as to define an internal pedestal collector region.

2. A method for fabricating a pedestal transistor in monolithic form as in claim 1 wherein:

a. the insulating layer is introduced into the epitaxial layer by ion implantation.

3. A method for fabricating a pedestal transistor in monolithic form as in claim 2 wherein:

a. a base region is formed by introducing an impurity into the expitaxial region.

4. A method for forming a pedestal transistor in monolithic form comprising the steps of claim 2 and further including:

a. controlling the formation of the epitaxial region so that a portion thereof constitutes a base region.

5. The method for fabricating a pedestal transistor as in claim 1 wherein said insulating layer positioned over the extrinsic buried sub-collector region including upwardly extending sidewalls that extend to the surface of the epitaxial layer.

6. The method for fabricating a pedestal transistor as in claim 5 wherein a second amorphous layer is introduced into the epitaxial layer, the layer being positioned beneath said buried sub-collector in said substrate.

7. The method for fabricating a pedestal transistor as in claim 6 wherein said second insulating layer including upwardly extending sidewalls that extend to the surface of the epitaxial layer.

* * * * *